United States Patent
Zhou et al.

(10) Patent No.: US 9,871,191 B2
(45) Date of Patent: *Jan. 16, 2018

(54) MAGNETIC RANDOM ACCESS MEMORY WITH ULTRATHIN REFERENCE LAYER

(71) Applicant: Avalanche Technology, Inc., Fremont, CA (US)

(72) Inventors: Yuchen Zhou, San Jose, CA (US); Yiming Huai, Pleasanton, CA (US); Zihui Wang, Milpitas, CA (US); Xiaojie Hao, Milpitas, CA (US); Huadong Gan, Fremont, CA (US); Xiaobin Wang, Fremont, CA (US)

(73) Assignee: Avalanche Technology, Inc., Fremont, CA (US)

( * ) Notice: Subject to any disclaimer, the term of this patent is extended or adjusted under 35 U.S.C. 154(b) by 32 days.

This patent is subject to a terminal disclaimer.

(21) Appl. No.: 14/730,073

(22) Filed: Jun. 3, 2015

(65) Prior Publication Data
US 2015/0311431 A1    Oct. 29, 2015

Related U.S. Application Data

(63) Continuation of application No. 14/263,046, filed on Apr. 28, 2014.

(51) Int. Cl.
*H01L 43/08* (2006.01)
*G11C 11/16* (2006.01)

(52) U.S. Cl.
CPC ............ *H01L 43/08* (2013.01); *G11C 11/161* (2013.01)

(58) Field of Classification Search
CPC ......... H01L 43/00; H01L 27/22; H01L 29/82; H01L 27/00
See application file for complete search history.

(56) References Cited

U.S. PATENT DOCUMENTS

| 7,390,584 B2 * | 6/2008 | Daughton | B82Y 25/00 360/324.12 |
| 9,070,855 B2 * | 6/2015 | Gan | H01L 43/02 |

(Continued)

OTHER PUBLICATIONS

Gan et al., "Perpendicular magnetic tunnel junction with thin CoFeB/Ta/Co/Pd/Co reference layer," Applied Physics Letters, 2014, pp. 192403-1 to 192403-5, vol. 105.

(Continued)

*Primary Examiner* — Benjamin Sandvik
(74) *Attorney, Agent, or Firm* — Bing K. Yen

(57) ABSTRACT

The present invention is directed to an MRAM device comprising a plurality of MTJ memory elements. Each of the memory elements includes a magnetic free layer and a first magnetic reference layer with an insulating tunnel junction layer interposed therebetween; a second magnetic reference layer formed adjacent to the first magnetic reference layer opposite the insulating tunnel junction layer; an anti-ferromagnetic coupling layer formed adjacent to the second magnetic reference layer opposite the first magnetic reference layer; and a magnetic fixed layer formed adjacent to the anti-ferromagnetic coupling layer. The magnetic free layer has a variable magnetization direction substantially perpendicular to the layer plane thereof. The first and second magnetic reference layers have a first fixed magnetization direction substantially perpendicular to the layer planes thereof. The magnetic fixed layer has a second fixed magnetization direction that is substantially perpendicular to the layer plane thereof and is substantially opposite to the first fixed magnetization direction.

20 Claims, 4 Drawing Sheets

(56) References Cited

U.S. PATENT DOCUMENTS

| | | | |
|---|---|---|---|
| 9,306,154 B2* | 4/2016 | Gan | H01F 10/3286 |
| 2007/0183187 A1* | 8/2007 | Guo | B82Y 25/00 |
| | | | 365/158 |
| 2012/0267733 A1* | 10/2012 | Hu | G11C 11/16 |
| | | | 257/421 |
| 2015/0311252 A1* | 10/2015 | Gan | H01L 43/08 |
| | | | 257/421 |

OTHER PUBLICATIONS

Gottwals et al., "Scalable and thermally robust perpendicular magnetic tunnel junctions for STT-MRAM," Applied Physics Letters, 2015, pp. 032413-1 to 032413-4, vol. 106.

* cited by examiner

MAGNETIC RANDOM ACCESS MEMORY WITH ULTRATHIN REFERENCE LAYER

CROSS-REFERENCE TO RELATED APPLICATIONS

The present application is a continuation of the commonly assigned application bearing Ser. No. 14/263,046 filed Apr. 28, 2014, entitled "MAGNETIC RANDOM ACCESS MEMORY WITH ULTRATHIN REFERENCE LAYER," which is incorporated herein by reference.

BACKGROUND

The present invention relates to a magnetic random access memory (MRAM) device, and more particularly, to a spin transfer torque (STT) MRAM device including therein an ultrathin perpendicular reference layer.

Spin transfer torque magnetic random access memory (STT-MRAM) is a new class of non-volatile memory, which can retain the stored information when powered off. An STT-MRAM device normally comprises an array of memory cells, each of which includes at least a magnetic memory element and a selection element coupled in series between appropriate electrodes. Upon application of an appropriate voltage or current to the magnetic memory element, the electrical resistance of the magnetic memory element would change accordingly, thereby switching the stored logic in the respective memory cell.

FIG. 1 shows a conventional memory element for an STT-MRAM device comprising a magnetic reference layer 50 and a magnetic free layer 52 with an insulating tunnel junction layer 54 interposed therebetween, thereby collectively forming a magnetic tunneling junction (MTJ) 56. The magnetic reference layer 50 and free layer 52 have a fixed magnetization direction 58 and a variable magnetization direction 60, respectively, which are substantially perpendicular to the layer planes thereof. Therefore, the MTJ 56 is a perpendicular type comprising the magnetic layers 50 and 52 with perpendicular anisotropy. Upon application of an appropriate current through the perpendicular MTJ 56, the magnetization direction 60 of the magnetic free layer 52 can be switched between two directions: parallel and anti-parallel with respect to the magnetization direction 58 of the magnetic reference layer 50. The insulating tunnel junction layer 54 is normally made of a dielectric material with a thickness ranging from a few to a few tens of angstroms. However, when the magnetization directions 60 and 58 of the magnetic free layer 52 and reference layer 50 are substantially parallel, electrons polarized by the magnetic reference layer 50 can tunnel through the insulating tunnel junction layer 54, thereby decreasing the electrical resistivity of the perpendicular MTJ 56. Conversely, the electrical resistivity of the perpendicular MTJ 56 is high when the magnetization directions 58 and 60 of the magnetic reference layer 50 and free layer 52 are substantially anti-parallel. Accordingly, the stored logic in the magnetic memory element can be switched by changing the magnetization direction 60 of the magnetic free layer 52.

The magnetic reference layer 50 often includes therein a thick multilayer or superlattice structure for enhancing the perpendicular anisotropy. A typical multilayer structure has a thickness range of several to tens of nanometer and thus a relatively large magnetic moment. The large magnetic moment of the multilayer structure and a strong dipole coupling between the magnetic reference layer 50 and free layer 52 produce a large stray field exerted on the magnetic free layer 52, which reduces the stability of the anti-parallel magnetization configuration and makes the parallel-to-anti-parallel switching current higher than anti-parallel-to-parallel switching current. The stray field exerted on the magnetic free layer 52 by the magnetic reference layer 50 may be partially or completely canceled by adding magnetic layers with a fixed magnetization direction that is opposite to the fixed magnetization direction 58 of the magnetic reference layer 50. However, doing so would undesirably increase the total thickness of the magnetic layers in the memory element, thereby adversely reducing the etching process margin for thick MTJ layer stack in a dense array.

For the foregoing reasons, there is a need for an STT-MRAM device having a minimum stray field at the magnetic free layer while the total thickness of the MTJ memory element is minimized.

SUMMARY

The present invention is directed to an STT-MRAM device that satisfies this need. A device having features of the present invention comprises a plurality of MTJ memory elements. Each of the MTJ memory elements includes a magnetic free layer and a first magnetic reference layer with an insulating tunnel junction layer interposed therebetween; a second magnetic reference layer formed adjacent to the first magnetic reference layer opposite the insulating tunnel junction layer; an anti-ferromagnetic coupling layer formed adjacent to the second magnetic reference layer opposite the first magnetic reference layer; and a magnetic fixed layer formed adjacent to the anti-ferromagnetic coupling layer. The magnetic free layer has a variable magnetization direction substantially perpendicular to the layer plane thereof. The first and second magnetic reference layers have a first fixed magnetization direction substantially perpendicular to the layer planes thereof. The magnetic fixed layer has a second fixed magnetization direction that is substantially perpendicular to the layer plane thereof and is substantially opposite to the first fixed magnetization direction. The first magnetic reference layer may be made of an alloy comprising cobalt, iron, and boron. The second magnetic reference layer may be made of an alloy comprising cobalt and boron. The total combined thickness of the first and second magnetic reference layers may be in the range of about 0.8 to 1.5 nm.

Each of the MTJ memory elements may further comprise a non-magnetic tuning layer formed adjacent to the magnetic free layer opposite the insulating tunnel junction layer and a magnetic compensation layer formed adjacent to the non-magnetic tuning layer opposite the magnetic free layer. The magnetic compensation layer having a third fixed magnetization direction that is substantially perpendicular to the layer plane thereof and is substantially opposite to the first fixed magnetization direction.

BRIEF DESCRIPTION OF THE DRAWINGS

These and other features, aspects, and advantages of the present invention will become better understood with regard to the following description, appended claims, and accompanying drawings where:

For purposes of clarity and brevity, like elements and components will bear the same designations and numbering throughout the Figures, which are not necessarily drawn to scale.

DETALIED DESCRIPTION

Figure 1:
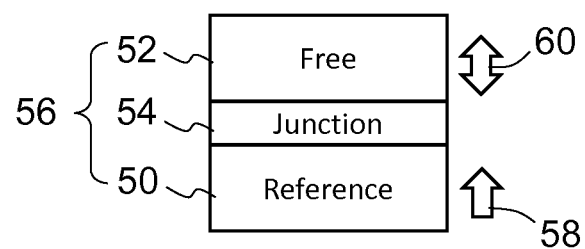
FIG. 1 is a cross sectional view of a conventional perpendicular magnetic tunnel junction.

In the Summary above and in the Detailed Description, and the claims below, and in the accompanying drawings, reference is made to particular features of the invention. It is to be understood that the disclosure of the invention in this specification includes all possible combinations of such particular features. For example, where a particular feature is disclosed in the context of a particular aspect or embodiment of the invention, or a particular claim, that feature can also be used, to the extent possible, in combination with and/or in the context of other particular aspects and embodiments of the invention, and in the invention generally.

Where reference is made herein to a material AB composed of element A and element B, the material AB can be an alloy, a compound, or a combination thereof, except where the context excludes that possibility.

The term "noncrystalline" means an amorphous state or a state in which fine crystals are dispersed in an amorphous matrix, not a single crystal or polycrystalline state. In case of state in which fine crystals are dispersed in an amorphous matrix, those in which a crystalline peak is substantially not observed by, for example, X-ray diffraction can be designated as "noncrystalline."

The term "superlattice" means a synthetic periodic structure of layers of at least two constituent materials. A superlattice has at least two repeated unit stacks with each unit stack formed by laminating the constituent materials. Because of the periodic nature of its structure, a superlattice may exhibit characteristic satellite peaks when analyzed by diffraction methods, such as X-ray diffraction and neutron diffraction. For example, a $[Co/Pt]_n$ superlattice would denote a structure formed by n stacks of bilayer structure of cobalt (Co) and platinum (Pt).

The term "magnetic dead layer" means a layer of supposedly ferromagnetic material that does not exhibit a net magnetic moment in the absence of an external magnetic field. A magnetic dead layer of several atomic layers may form in a magnetic film in contact with another layer material owing to intermixing of atoms at the interface. Alternatively, a magnetic dead layer may form as thickness of a magnetic film decreases to a point that the magnetic film becomes superparamagnetic.

The term "at least" followed by a number is used herein to denote the start of a range beginning with that number, which may be a range having an upper limit or no upper limit, depending on the variable being defined. For example, "at least 1" means 1 or more than 1. The term "at most" followed by a number is used herein to denote the end of a range ending with that number, which may be a range having 1 or 0 as its lower limit, or a range having no lower limit, depending upon the variable being defined. For example, "at most 4" means 4 or less than 4, and "at most 40%" means 40% or less than 40%. When, in this specification, a range is given as "(a first number) to (a second number)" or "(a first number)-(a second number)," this means a range whose lower limit is the first number and whose upper limit is the second number. For example, "25 to 100 nm" means a range whose lower limit is 25 nm and whose upper limit is 100 nm.

Figure 2:
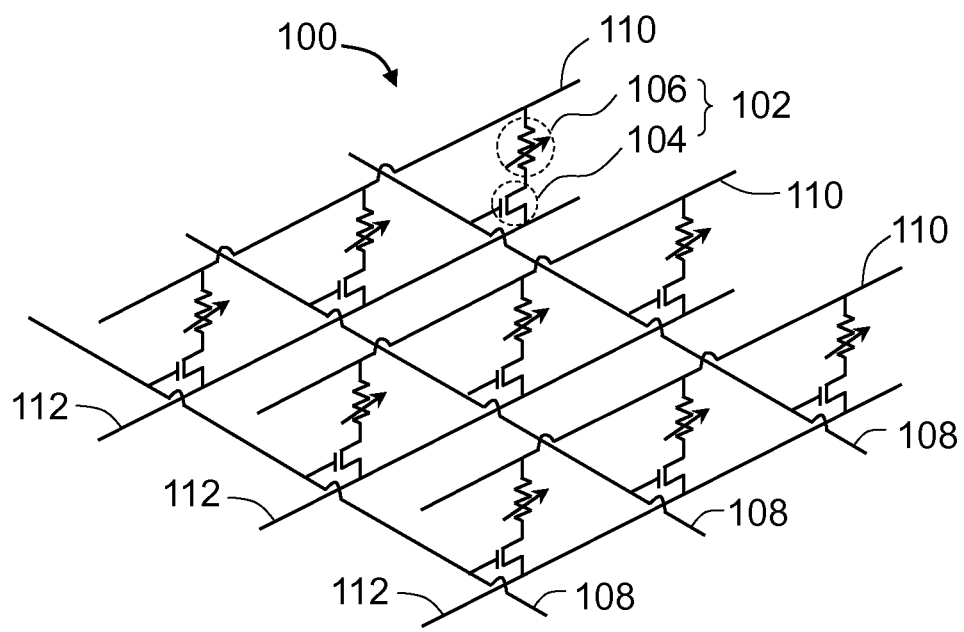
FIG. 2 is a schematic circuit diagram of a STT-MRAM device according to an embodiment of the present invention.

FIG. 2 is a schematic circuit diagram of an STT-MRAM device 100 according to an embodiment of the present invention. The STT-MRAM device 100 comprises a plurality of memory cells 102, each of the memory cells 102 including a selection transistor 104 coupled to a MTJ memory element 106; a plurality of parallel word lines 108 with each being coupled to a respective row of the selection transistors 104 in a first direction; and a plurality of parallel bit lines 110 with each being coupled to a respective row of the memory elements 106 in a second direction perpendicular to the first direction; and optionally a plurality of parallel source lines 112 with each being coupled to a respective row of the selection transistors 104 in the first or second direction.

Figure 3A:
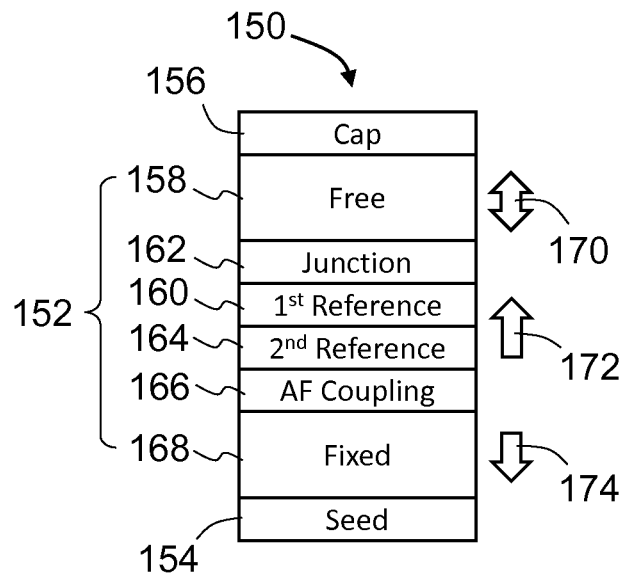
FIGS. 3A and 3B are cross sectional views of an embodiment of the present invention as applied to a perpendicular MTJ memory element.

The MTJ memory element 106 has a perpendicular MTJ structure that includes an ultrathin dual reference layer. An embodiment of the present invention as applied to a perpendicular MTJ memory element will now be described with reference to FIG. 3A. Referring now to FIG. 3A, the illustrated memory element 150 includes an MTJ structure 152 formed in between an optional non-magnetic seed layer 154 and an optional non-magnetic cap layer 156. The MTJ structure 152 comprises a magnetic free layer 158 and a first magnetic reference layer 160 with an insulating tunnel junction layer 162 interposed therebetween, a second magnetic reference layer 164 formed adjacent to the first magnetic reference layer opposite the insulating tunnel junction layer 162, an anti-ferromagnetic coupling layer 166 formed adjacent to the second magnetic reference layer 164 opposite the first magnetic reference layer 160, and a magnetic fixed layer 168 formed adjacent to the anti-ferromagnetic coupling layer 166 opposite the second magnetic reference layer 164. The optional non-magnetic seed layer 154 and cap layer 156 are formed adjacent to the magnetic fixed layer 168 and the magnetic free layer 158, respectively.

The magnetic free layer 158 has a variable magnetization direction 170 substantially perpendicular to the layer plane thereof. The first and second magnetic reference layers 160 and 164 have a first fixed magnetization direction 172 substantially perpendicular to the layer planes thereof. The magnetic fixed layer 168 has a second fixed magnetization direction 174 that is substantially perpendicular to the layer plane thereof and is opposite to the first fixed magnetization direction 172.

Figure 3B:
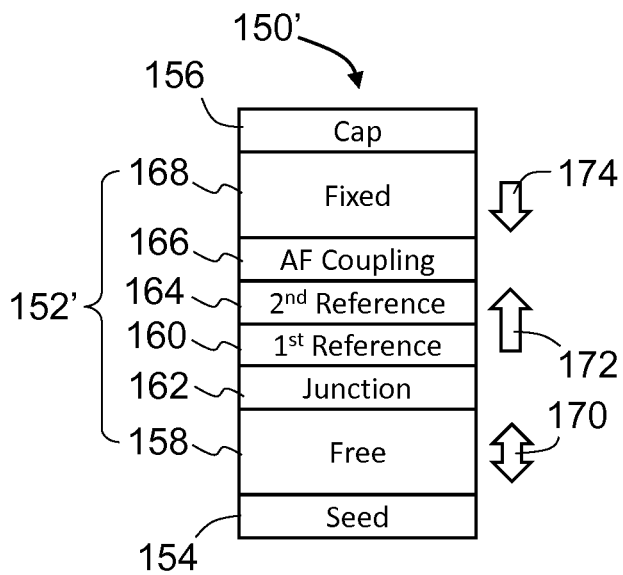

The stacking order of the individual layers 158-168 in the MTJ structure of 152 of the memory element 150 may be inverted as illustrated in FIG. 3B without affecting the device performance. The memory element 150' of FIG. 3B has an MTJ structure 152' that has the same layers 158-168 but with an inverted stacking order comparing with the MTJ structure 152. Accordingly, the optional non-magnetic seed layer 154 and cap layer 156 are formed adjacent to the magnetic free layer 158 and the magnetic fixed layer 168, respectively.

Figure 4A:
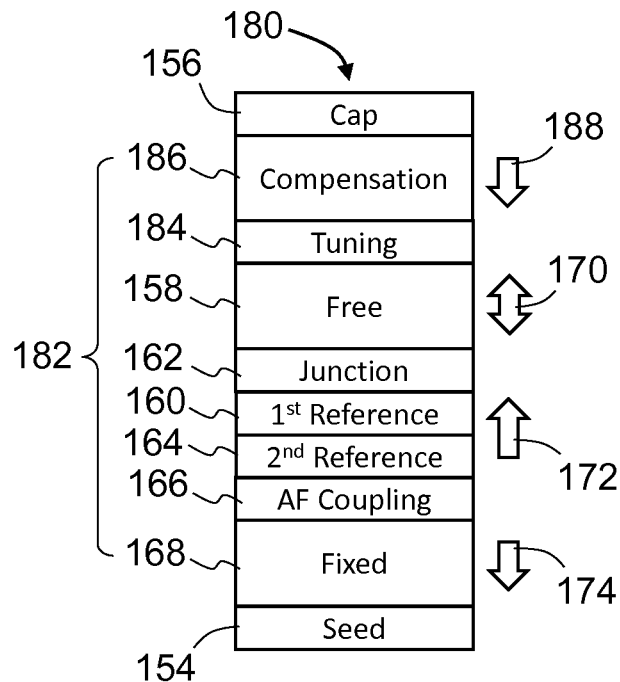
FIGS. 4A and 4B are cross sectional views of another embodiment of the present invention as applied to a perpendicular MTJ memory element.

Another embodiment of the present invention as applied to a MTJ memory element is illustrated in FIG. 4A. In the drawing, numerals 154 to 174 denote the same components or features as those shown in FIGS. 3A and 3B. The illustrated memory element 180 includes an MTJ structure 182 formed in between an optional non-magnetic seed layer 154 and an optional non-magnetic cap layer 156. The MTJ structure 182 comprises a magnetic free layer 158 and a first magnetic reference layer 160 with an insulating tunnel junction layer 162 interposed therebetween, a second magnetic reference layer 164 formed adjacent to the first magnetic reference layer opposite the insulating tunnel junction layer 162, an anti-ferromagnetic coupling layer 166 formed adjacent to the second magnetic reference layer 164 opposite the first magnetic reference layer 160, a magnetic fixed layer 168 formed adjacent to the anti-ferromagnetic coupling layer 166 opposite the second magnetic reference layer 164, a non-magnetic tuning layer 184 formed adjacent to the magnetic free layer 158 opposite the insulating tunnel junction layer 162, and a magnetic compensation layer 186 formed adjacent to the non-magnetic tuning layer 184 opposite the magnetic free layer 158. The optional non-magnetic seed layer 154 and cap layer 156 are formed adjacent to the magnetic fixed layer 168 and the magnetic compensation layer 186, respectively.

The magnetic free layer 158 has a variable magnetization direction 170 substantially perpendicular to the layer plane thereof. The first and second magnetic reference layers 160 and 164 have a first fixed magnetization direction 172 substantially perpendicular to the layer planes thereof. The magnetic fixed layer 168 has a second fixed magnetization direction 174 that is substantially perpendicular to the layer plane thereof and is opposite to the first fixed magnetization direction 172. The magnetic compensation layer 186 has a third fixed magnetization direction 188 that is substantially perpendicular to the layer plane thereof and is opposite to the first fixed magnetization direction 172. The memory element 180 of FIG. 4A is different from the memory element 150 of FIG. 3A in that the non-magnetic tuning layer 184 and the magnetic compensation layer 186 are added to the MTJ structure 182.

Figure 4B:
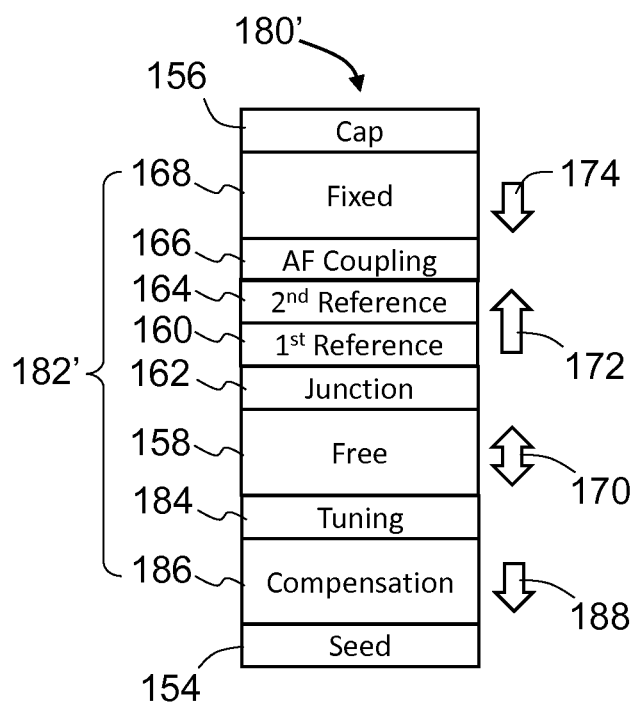

The stacking order of the individual layers 158-168 and 184-186 in the MTJ structure of 182 of the memory element 180 may be inverted as illustrated in FIG. 4B without affecting the device performance. The memory element 180' of FIG. 4B has an MTJ structure 182' that has the same layers 158-168 and 184-186 but with an inverted stacking order comparing with the MTJ structure 182. Accordingly, the optional non-magnetic seed layer 154 and cap layer 156 are formed adjacent to the magnetic compensation layer 186 and the magnetic fixed layer 168, respectively.

The magnetic free layer 158 of the MTJ memory elements of FIGS. 3A, 3B, 4A, and 4B may comprise one or more magnetic sublayers in contiguous contact. Each of the magnetic sublayers may comprise one or more ferromagnetic elements, such as but not limited to cobalt (Co), nickel (Ni), and iron (Fe), to form a magnetic material, such as but not limited to Co, Ni, Fe, CoNi, CoFe, NiFe, or CoNiFe. The magnetic material of each of the magnetic sublayers may optionally include at least one non-magnetic element, such as but not limited to boron (B), titanium (Ti), zirconium (Zr), hafnium (Hf), vanadium (V), niobium (Nb), tantalum (Ta), chromium (Cr), molybdenum (Mo), tungsten (W), aluminum (Al), silicon (Si), germanium (Ge), gallium (Ga), oxygen (O), nitrogen (N), carbon (C), platinum (Pt), palladium (Pd), and phosphorus (P), to form a magnetic alloy or compound, such as but not limited to cobalt-iron-boron (CoFeB), cobalt-iron-boron-titanium (CoFeBTi), cobalt-iron-boron-zirconium, (CoFeBZr), cobalt-iron-boron-hafnium (CoFeBHf), cobalt-iron-boron-vanadium (CoFeBV), cobalt-iron-boron-tantalum (CoFeBTa), cobalt-iron-boron-chromium (CoFeBCr), cobalt-iron-titanium (CoFeTi), cobalt-iron-zirconium (CoFeZr), cobalt-iron-hafnium (CoFeHf), cobalt-iron-vanadium (CoFeV), cobalt-iron-niobium (CoFeNb), cobalt-iron-tantalum (CoFeTa), cobalt-iron-chromium (CoFeCr), cobalt-iron-molybdenum (CoFeMo), cobalt-iron-tungsten (CoFeW), cobalt-iron-aluminum (CoFeAl), cobalt-iron-silicon (CoFeSi), cobalt-iron-germanium (CoFeGe), or cobalt-iron-phosphorous (CoFeP). In an embodiment, the magnetic free layer 158 is made of a single layer of CoFeB.

The insulating tunnel junction layer 162 of the MTJ memory elements of FIGS. 3A, 3B, 4A, and 4B has an energy barrier through which electrons can pass by tunnel effect. The insulating tunnel junction layer 162 may be made of any suitable insulating material, such as but not limited to magnesium oxide and aluminum oxide.

Each of the first and second magnetic reference layers 160 and 164 of the MTJ memory elements of FIGS. 3A, 3B, 4A, and 4B may comprise one or more ferromagnetic elements, such as but not limited to Co, Ni, and Fe, to form a magnetic material, such as but not limited to Co, Ni, Fe, CoNi, CoFe, NiFe, or CoNiFe. The magnetic material of each of the first and second magnetic reference layers 160 and 164 may optionally include at least one non-magnetic element, such as but not limited to samarium (Sm), neodymium (Nd), B, Ti, Zr, Hf, V, Nb, Ta, Cr, Mo, W, Al, Si, Ge, Ga, O, N, C, Pt, Pd, or P, to form a magnetic alloy or compound, such as but not limited to SmCo, NdFeB, FePt, CoPt, CoFeB, CoFeBTi, CoFeBZr, CoFeBHf, CoFeBV, CoFeBTa, CoFeBCr, CoFeTi, CoFeZr, CoFeHf, CoFeV, CoFeNb, CoFeTa, CoFeCr, CoFeMo, CoFeW, CoFeAl, CoFeSi, CoFeGe, CoFeP, CoCr, CoCrB, CoCrPt, CoCrPtB, CoCrPd, CoCrTi, CoCrZr, CoCrHf, CoCrV, CoCrNb, or CoCrTa.

The combined total thickness of the first and second magnetic reference layers 160 and 164 is at most about 3.0 nm, preferably at most about 2.0 nm, more preferably about 0.8 to 1.5 nm. In an embodiment, the first magnetic reference layer 160 is made of CoFeB and has a thickness range of about 0.8 to 1.2 nm, while the second magnetic reference layer 164 is made of CoFe and has a thickness range of about 0.1 to 0.5 nm. In another embodiment, the first magnetic reference layer 160 is made of CoFeB and has a thickness range of about 0.4 to 1.0 nm, while the second magnetic reference layer 164 is made of CoFe and has a thickness range of about 0.3 to 0.8 nm.

One of the functions of the magnetic fixed layer 168 of the MTJ memory elements of FIGS. 3A, 3B, 4A, and 4B is to provide anti-ferromagnetic coupling to the magnetic reference layers 160 and 164 by pinning the magnetization direction 172 thereof in anti-parallel orientation relative to that of the magnetic fixed layer 168 through the anti-ferromagnetic coupling layer 166, which may be made of a material comprising at least one element selected from the group consisting of ruthenium, rhodium, iridium, tantalum, manganese, oxygen, and nitrogen. Another function of the magnetic fixed layer 168, which has an opposite magnetization direction 174 compared with the magnetic reference layers 160 and 164, is to cancel, as much as possible, the stray magnetic field exerted by the magnetic reference layers 160 and 164 on the magnetic free layer 158, thereby minimizing the offset field or net external field at the magnetic free layer 158.

The magnetic fixed layer 168 may comprise one or more ferromagnetic elements, such as but not limited to Co, Ni, and Fe, to form a magnetic material, such as but not limited to Co, Ni, Fe, CoNi, CoFe, NiFe, or CoNiFe. The magnetic material of the magnetic fixed layer 168 may optionally include at least one non-magnetic element, such as but not limited to Sm, Nd, B, Ti, Zr, Hf, V, Nb, Ta, Cr, Mo, W, Al, Si, Ge, Ga, O, N, C, Pt, Pd, or P, to form a magnetic alloy or compound, such as but not limited to SmCo, NdFeB, FePt, CoPt, CoFeB, CoFeBTi, CoFeBZr, CoFeBHf, CoFeBV, CoFeBTa, CoFeBCr, CoFeTi, CoFeZr, CoFeHf, CoFeV, CoFeNb, CoFeTa, CoFeCr, CoFeMo, CoFeW, CoFeAl, CoFeSi, CoFeGe, CoFeP, CoCr, CoCrB, CoCrPt, CoCrPtB, CoCrPd, CoCrTi, CoCrZr, CoCrHf, CoCrV, CoCrNb, or CoCrTa.

Alternatively, the magnetic fixed layer 168 may have a multilayer structure formed by interleaving at least two different types of materials with at least one of the at least two different types of materials being magnetic, such as but not limited to $[Co/Pt]_n$, $[Co/Pd]_n$, $[Co/Ni]_n$, $[CoFe/Pt]_n$, or $[Co/Pt(Pd)]_n$. The multilayer structure of the magnetic fixed layer 168 may or may not exhibit the characteristic satellite peaks associated with superlattice when analyzed by X-ray or neutron diffraction. The non-magnetic or weak magnetic layer of the multilayer structure, i.e. Pt, Pd, or Ni, is preferably formed at the bottom of the magnetic fixed layer 168. In the MTJ structures of FIGS. 3A and 4A, for example, the non-magnetic or weak magnetic layer formed at the bottom of the multilayer structure is preferably in contact with the non-magnetic seed layer 154 therebeneath. Similarly, in the MTJ structures of FIGS. 3B and 4B, the non-magnetic or weak magnetic layer formed at the bottom of the multilayer structure is preferably in contact with the anti-ferromagnetic coupling layer 166 therebeneath. In an embodiment, the magnetic fixed layer 168 has a $[Co/Pt]_n$ or $[Co/Pd]_n$ multilayer structure with a Pt or Pd layer formed at the bottom thereof.

The main function of the magnetic compensation layer 186 of the MTJ memory elements of FIGS. 4A and 4B, which has an opposite magnetization direction 188 compared with the magnetic reference layers 160 and 164, is to cancel, as much as possible, the stray magnetic field exerted by the magnetic reference layers 160 and 164 on the magnetic free layer 158, thereby minimizing the offset field or net external field at the magnetic free layer 158.

The magnetic compensation layer 186 may comprise one or more ferromagnetic elements, such as but not limited to Co, Ni, and Fe, to form a magnetic material, such as but not limited to Co, Ni, Fe, CoNi, CoFe, NiFe, or CoNiFe. The magnetic material of the magnetic compensation layer 186 may optionally include at least one non-magnetic element, such as but not limited to Sm, Nd, B, Ti, Zr, Hf, V, Nb, Ta, Cr, Mo, W, Al, Si, Ge, Ga, O, N, C, Pt, Pd, or P, to form a magnetic alloy or compound, such as but not limited to SmCo, NdFeB, FePt, CoPt, CoFeB, CoFeBTi, CoFeBZr, CoFeBHf, CoFeBV, CoFeBTa, CoFeBCr, CoFeTi, CoFeZr, CoFeHf, CoFeV, CoFeNb, CoFeTa, CoFeCr, CoFeMo, CoFeW, CoFeAl, CoFeSi, CoFeGe, CoFeP, CoCr, CoCrB, CoCrPt, CoCrPtB, CoCrPd, CoCrTi, CoCrZr, CoCrHf, CoCrV, CoCrNb, or CoCrTa.

Alternatively, the magnetic compensation layer 186 may have a multilayer structure formed by interleaving at least two different types of materials with at least one of the at least two different types of materials being magnetic, such as but not limited to $[Co/Pt]_n$, $[Co/Pd]_n$, $[Co/Ni]_n$, $[CoFe/Pt]_n$, or $[Co/Pt(Pd)]_n$. The multilayer structure of the magnetic compensation layer 186 may or may not exhibit the characteristic satellite peaks associated with superlattice when analyzed by diffraction methods, such as X-ray diffraction and neutron diffraction. The non-magnetic or weak magnetic layer of the multilayer structure, i.e. Pt, Pd, or Ni, is preferably formed at the bottom of the magnetic compensation layer 186. In the MTJ structures of FIG. 4A, for example, the non-magnetic or weak magnetic layer formed at the bottom of the multilayer structure is preferably in contact with the non-magnetic tuning layer 184 therebeneath. Similarly, in the MTJ structures of FIG. 4B, the non-magnetic or weak magnetic layer formed at the bottom of the multilayer structure is preferably in contact with the non-magnetic seed layer 154 therebeneath. In an embodiment, the magnetic compensation layer 186 has a $[Co/Pt]_n$ or $[Co/Pd]_n$ multilayer structure with a Pt or Pd layer formed at the bottom thereof.

Figure 5A:
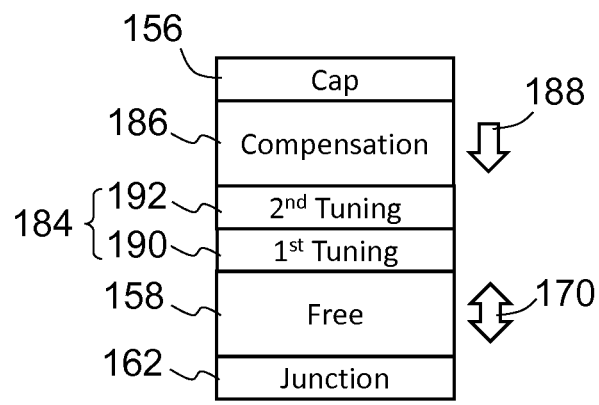
FIGS. 5A and 5B are cross sectional views of an embodiment of the present invention as applied to a non-magnetic tuning layer.
Figure 5B:
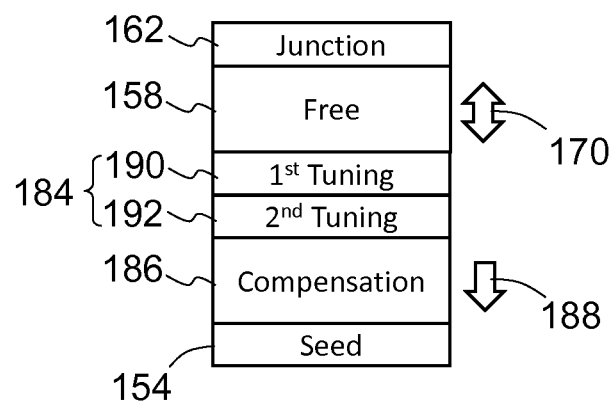

The non-magnetic tuning layer 184 of the MTJ memory elements of FIGS. 4A and 4B serves to adjust the amplitude of the magnetic field exerted on the magnetic free layer 158 by the magnetic compensation layer 186 by maintaining a distance therebetween. The amplitude of the magnetic field increases with decreasing thickness of the non-magnetic tuning layer 184 as the magnetic compensation layer 186 and the magnetic free layer 158 become closer. The non-magnetic tuning layer 184 may include therein one or more sublayers with each sublayer comprising one or more metallic elements selected from the group consisting of Ti, Zr, Hf, V, Nb, Ta, Cr, Mo, W, Pd, Pt, Co, Ni, Fe, rhodium (Rh), copper (Cu), and silver (Ag). Each sublayer of the non-magnetic tuning layer 184 may further include at least one non-magnetic element selected from the group consisting of oxygen (O), nitrogen (N), carbon (C) and silicon (Si), to form an alloy or compound, such as but not limited to TiOx, TiN, TiC, TiSx, ZrOx, ZrN, HfOx, VN, VC, NbN, NbC, TaN, TaC, CrOx, MoOx, WOx, CoOx, or NiOx. The non-magnetic tuning layer 184 may contain one or more magnetic elements, such as Co, Ni, and Fe, at a concentration that is below the threshold required for becoming magnetized. In an embodiment, the non-magnetic tuning layer 184 is made of a layer of tantalum. In another embodiment as illustrated in FIGS. 5A and 5B, the non-magnetic tuning layer 184 comprises a first tuning sublayer 190 made of tantalum formed adjacent to the magnetic free layer 158 and a second tuning sublayer 192 made of ruthenium formed adjacent to the magnetic compensation layer 186.

The non-magnetic seed layer 154 and cap layer 156 of the MTJ memory elements of FIGS. 3A, 3B, 4A, and 4B each may comprise one or more metallic elements selected from the group consisting of Ti, Zr, Hf, V, Nb, Ta, Cr, Mo, W, Pd, Pt, Co, Ni, Fe, Rh, Cu, and Ag. Each of the non-magnetic seed layer 154 and cap layer 156 may further include at least one non-magnetic element selected from the group consisting of O, N, C and Si, to form an alloy or compound, such as but not limited to TiOx, TiN, TiC, TiSx, ZrOx, ZrN, HfOx, VN, VC, NbN, NbC, TaN, TaC, CrOx, MoOx, WOx, CoOx, or NiOx. Moreover, each of the non-magnetic seed layer 154 and cap layer 156 may contain one or more magnetic elements, such as Co, Ni, and Fe, at a concentration that is below the threshold required for becoming magnetized. In an embodiment, the non-magnetic seed layer 154 is made of tantalum or ruthenium. In another embodiment, the non-magnetic cap layer 156 is made of tantalum or ruthenium.

In contrast to the conventional magnetic reference layer structure that includes a thick multilayer structure which measures several to tens of nanometer thick, the present invention as applied to a perpendicular MTJ memory element allows the total thickness of the reference layer structure to be as thin as 1 nm in some embodiments while maintaining the perpendicular anisotropy thereof. Thinner magnetic reference layer structure, which has lower magnetic moment, results in thinner magnetic fixed layer and magnetic compensation layer required to counter balance the stray field generated by the magnetic reference layer structure. Therefore, the overall thickness of the MTJ memory element in accordance with the present invention is significantly reduced by decreasing the thickness of the magnetic reference layer structure, thereby improving the etching process margin.

All the features disclosed in this specification, including any accompanying claims, abstract, and drawings, may be replaced by alternative features serving the same, equivalent or similar purpose, unless expressly stated otherwise. Thus, unless expressly stated otherwise, each feature disclosed is one example only of a generic series of equivalent or similar features.

While the present invention has been shown and described with reference to certain preferred embodiments, it is to be understood that those skilled in the art will no doubt devise certain alterations and modifications thereto which nevertheless include the true spirit and scope of the present invention. Thus the scope of the invention should be determined by the appended claims and their legal equivalents, rather than by examples given.

What is claimed is:

1. A magnetic random access memory device comprising a plurality of magnetic tunnel junction (MTJ) memory elements, each of said memory elements comprising:
    a magnetic free layer and a first magnetic reference layer with an insulating tunnel junction layer interposed therebetween;
    a second magnetic reference layer formed adjacent to said first magnetic reference layer opposite said insulating tunnel junction layer;
    an anti-ferromagnetic coupling layer formed immediately adjacent to said second magnetic reference layer opposite said first magnetic reference layer; and
    a magnetic fixed layer formed adjacent to said anti-ferromagnetic coupling layer opposite said second magnetic reference layer,
    wherein said magnetic free layer has a variable magnetization direction substantially perpendicular to a layer plane thereof, said first and second magnetic reference layers have a first fixed magnetization direction substantially perpendicular to layer planes thereof, said magnetic fixed layer has a second fixed magnetization direction that is substantially perpendicular to a layer plane thereof and is substantially opposite to said first fixed magnetization direction, said second magnetic reference layer is made of a metallic alloy or a metallic compound or a homogeneous mixture thereof.

2. The magnetic random access memory device according to claim 1, wherein said second magnetic reference layer includes Co, Fe, or CoFe, and further includes one or more of Ti, Zr, Hf, V, Nb, Ta, Cr, Mo, W, Al, Si, Ge, Ga, Pt, and Pd.

3. The magnetic random access memory device according to claim 1, wherein said second magnetic reference layer comprises cobalt and platinum.

4. The magnetic random access memory device according to claim 1, wherein said second magnetic reference layer comprises iron and platinum.

5. The magnetic random access memory device according to claim 1, wherein said second magnetic reference layer comprises cobalt and iron.

6. The magnetic random access memory device according to claim 1, wherein said second magnetic reference layer comprises cobalt, iron, and tantalum.

7. The magnetic random access memory device according to claim 1, wherein said first magnetic reference layer is made of a magnetic material comprising cobalt and iron.

8. The magnetic random access memory device according to claim 1, wherein said first magnetic reference layer is made of CoFeB or CoFeTa.

9. The magnetic random access memory device according to claim 1, wherein said first and second magnetic reference layers are made of CoFeB and CoPt, respectively.

10. The magnetic random access memory device according to claim 1, wherein said first and second magnetic reference layers are made of CoFeB and CoFeTa, respectively.

11. The magnetic random access memory device according to claim 1, wherein said magnetic free layer is made of a magnetic material comprising cobalt and iron.

12. The magnetic random access memory device according to claim 1, wherein said magnetic free layer is made of CoFeB or CoFeTa.

13. The magnetic random access memory device according to claim 1, wherein said magnetic fixed layer has a multilayer structure formed by interleaving layers of a first type material with layers of a second type material, at least one of said first type and second type of materials being magnetic.

14. The magnetic random access memory device according to claim 13, wherein said first type material is Co or CoFe.

15. The magnetic random access memory device according to claim 13, wherein said second type material is Pt, Pd, Ni, or any combination thereof.

16. The magnetic random access memory device according to claim 1, wherein each of said memory elements further comprises a seed layer formed adjacent to said magnetic fixed layer opposite said anti-ferromagnetic coupling layer.

17. The magnetic random access memory device according to claim 16, wherein said seed layer is made of a material comprising nickel and titanium.

18. The magnetic random access memory device according to claim 16, wherein said seed layer is made of a material comprising nickel and tantalum.

19. The magnetic random access memory device according to claim 16, wherein said seed layer is made of a material comprising nickel and chromium.

20. The magnetic random access memory device according to claim 16, wherein said seed layer is made of a material comprising nickel and another element selected from the group consisting of zirconium, hafnium, vanadium, niobium, molybdenum, and tungsten.

* * * * *